United States Patent [19]
Du

[11] Patent Number: 6,144,874
[45] Date of Patent: Nov. 7, 2000

[54] RESPIRATORY GATING METHOD FOR MR IMAGING

[75] Inventor: Yiping Du, Towson, Md.

[73] Assignee: General Electric Company, Milwaukee, Wis.

[21] Appl. No.: 09/173,194

[22] Filed: Oct. 15, 1998

[51] Int. Cl.$^7$ .................................................. A61B 5/055
[52] U.S. Cl. .......................... 600/413; 324/307; 324/309
[58] Field of Search .................................... 600/410, 534, 600/413, 419, 420; 324/307, 309

[56] References Cited

U.S. PATENT DOCUMENTS

| | | | |
|---|---|---|---|
| 5,477,144 | 12/1995 | Rogers | 324/309 |
| 5,766,128 | 6/1998 | Halamek et al. | 600/410 |
| 5,873,825 | 2/1999 | Mistretta et al. | 600/410 |

OTHER PUBLICATIONS

Algorithms for Extracting Motion Information from Navigator Echoes, MRM 36:117–123 (1996), Wang, et al.
Improved Centric Phase Encoding Orders for Three–Dimensional Magnetization–Prepared MR Angiography, MRM 36:384–392 (1996), Wilman, et al.
Real–Time Motion Detection in Spiral MRI Using Navigators, MRM 32:639–645 (1994), Sachs, et al.
Respiratory Motion of the Heart: Kinematics and the Implications for the Spatial Resolution in Coronary Imaging, MRM 33:713–719 (1995), Wang, et al.

*Primary Examiner*—Marvin M. Lateef
*Assistant Examiner*—Eleni Mantis Mercader
*Attorney, Agent, or Firm*—Quarles & Brady; Christian G. Cabou; Phyllis Y. Price

[57] ABSTRACT

NMR data required to reconstruct an image is divided into central k-space views and peripheral k-space views. NMR navigator signals are acquired during a scan to indicate patient respiration and a first gating signal is produced when respiration is within a narrow acquisition window and a second gating signal is produced when respiration is within a wider acquisition window. Central k-space views are acquired when the first gating signal is produced and peripheral k-space views are acquired when the second gating signal is produced.

16 Claims, 5 Drawing Sheets

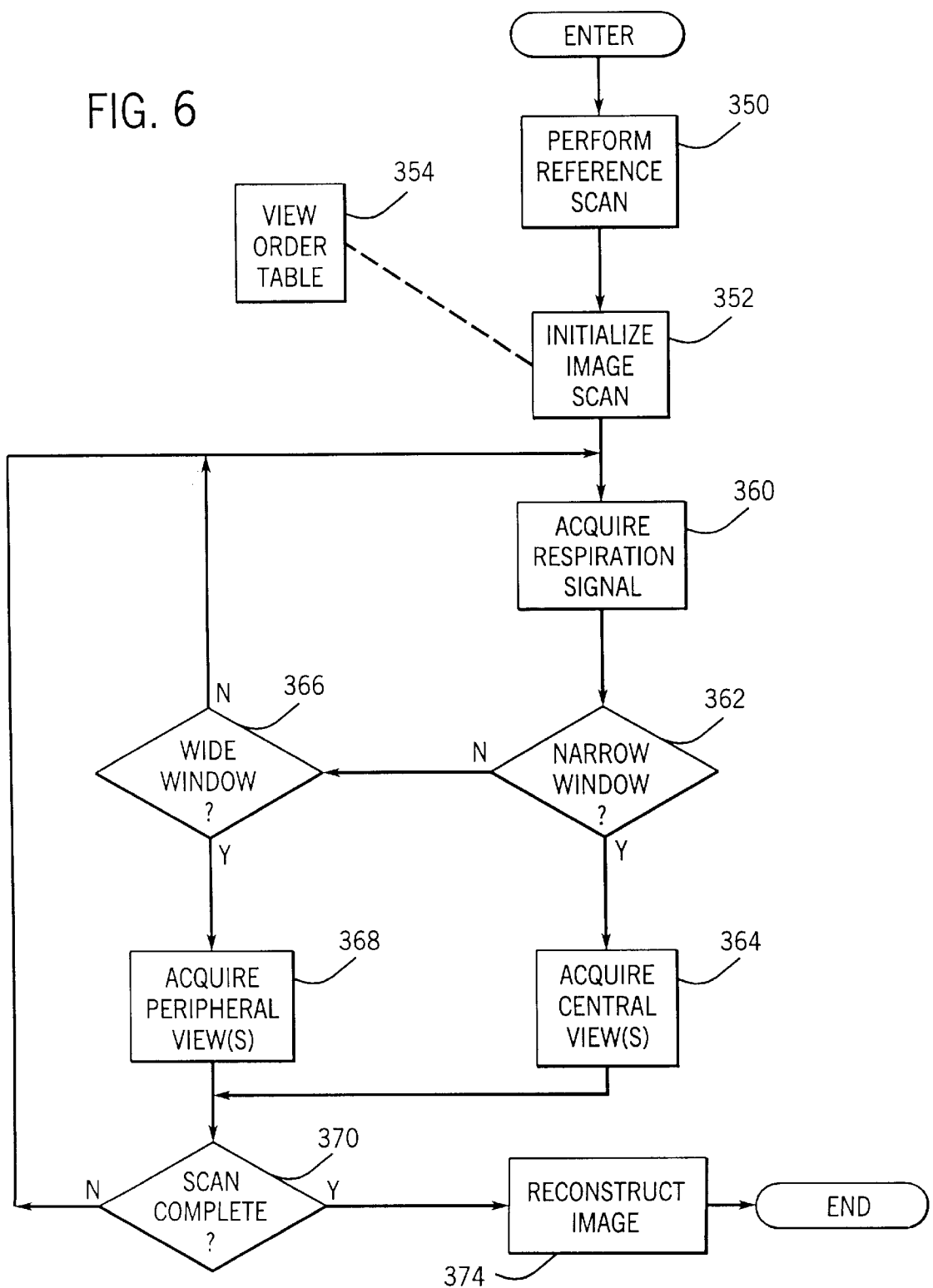

RESPIRATORY GATING METHOD FOR MR IMAGING

BACKGROUND OF THE INVENTION

The field of the invention is nuclear magnetic resonance imaging methods and systems. More particularly, the invention relates to the gating of NMR image data acquisition as a function of patient respiration.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins which may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($^{21}G_y$) in the sequence of "views" that are acquired during the scan to produce a set of NMR data from which an entire image can be reconstructed.

Most NMR scans currently used to produce high resolution 3D medical images, such as the image of coronary arteries, require many minutes to acquire the necessary data. Because of the long scan time, patient movement during the scan may be significant and can corrupt the reconstructed image with motion artifacts. There are also many types of patient motion such as respiratory motion, cardiac motion, blood flow, and peristalsis. There are many methods used to reduce or eliminate such motion artifacts including methods for reducing the motion (e.g. breath holding), methods for reducing the effects of motion (e.g. U.S. Pat. No. 20 4,663,591), and methods for correcting the acquired data for known motion (e.g. U.S. Pat. No. 5,200,700). In the case of respiratory motion, one of the best known methods for reducing motion artifacts is to gate the acquisition of data such that the views are acquired only during a preset portion of the respiratory cycle.

Prior respiratory gating methods employ a means for sensing patient respiration (e.g. U.S. Pat. No. 4,994,473) and producing a gating signal for the MRI system during a preset portion of the respiratory cycle. As long as the gating signal is produced, the MRI system acquires NMR data in the prescribed view order. During other parts of the respiratory cycle the gating signal is turned off and no data is acquired. As a result, when respiratory gating is used the scan time is increased significantly because data can only be acquired over a relatively short portion of each respiratory cycle.

SUMMARY OF THE INVENTION

The present invention is a method and apparatus for acquiring NMR data using respiratory gating that enables acquisition of data over a larger portion of each respiratory cycle without significantly reducing image quality. More particularly, the respiration of a subject being imaged is monitored, a first gating signal is produced when respiration is within a narrow window, a second gating signal is produced when respiration is within a wide window, the MRI system is enabled to acquire NMR data from the central region of k-space when the first gating signal is produced, the MRI system is enabled to acquire NMR data from the peripheral region of k-space when the second gating signal is produced, and no NMR data is acquired when neither gating signal is produced.

The invention enables the scan time to be shortened when using respiratory gating without significantly reducing image quality. It is known in the art that views from the central region of k-space where the phase encoding gradient is small contribute significantly to the quality of the reconstructed image. On the other hand, views from peripheral regions of k-space where the phase encoding gradient is high contribute less. The present invention takes advantage of this phenomenon of the spin warp methodology by creating two windows during each respiratory cycle in which k-space data can be acquired. The first gating signal enables the central region of k-space to be acquired over a narrow range of respiratory phases that insure a high quality image, and the second gating signal establishes a more relaxed standard by enabling peripheral k-space data to be acquired over a wider range of respiratory phases. Data can thus be acquired over a larger portion of each respiratory cycle without significantly reducing image quality.

BRIEF DESCRIPTION OF THE DRAWINGS

FIG. 6 is a flow chart which illustrates the preferred method of practicing the present invention with the MRI system of FIG. 1.

DESCRIPTION OF THE PREFERRED EMBODIMENT

Figure 1:
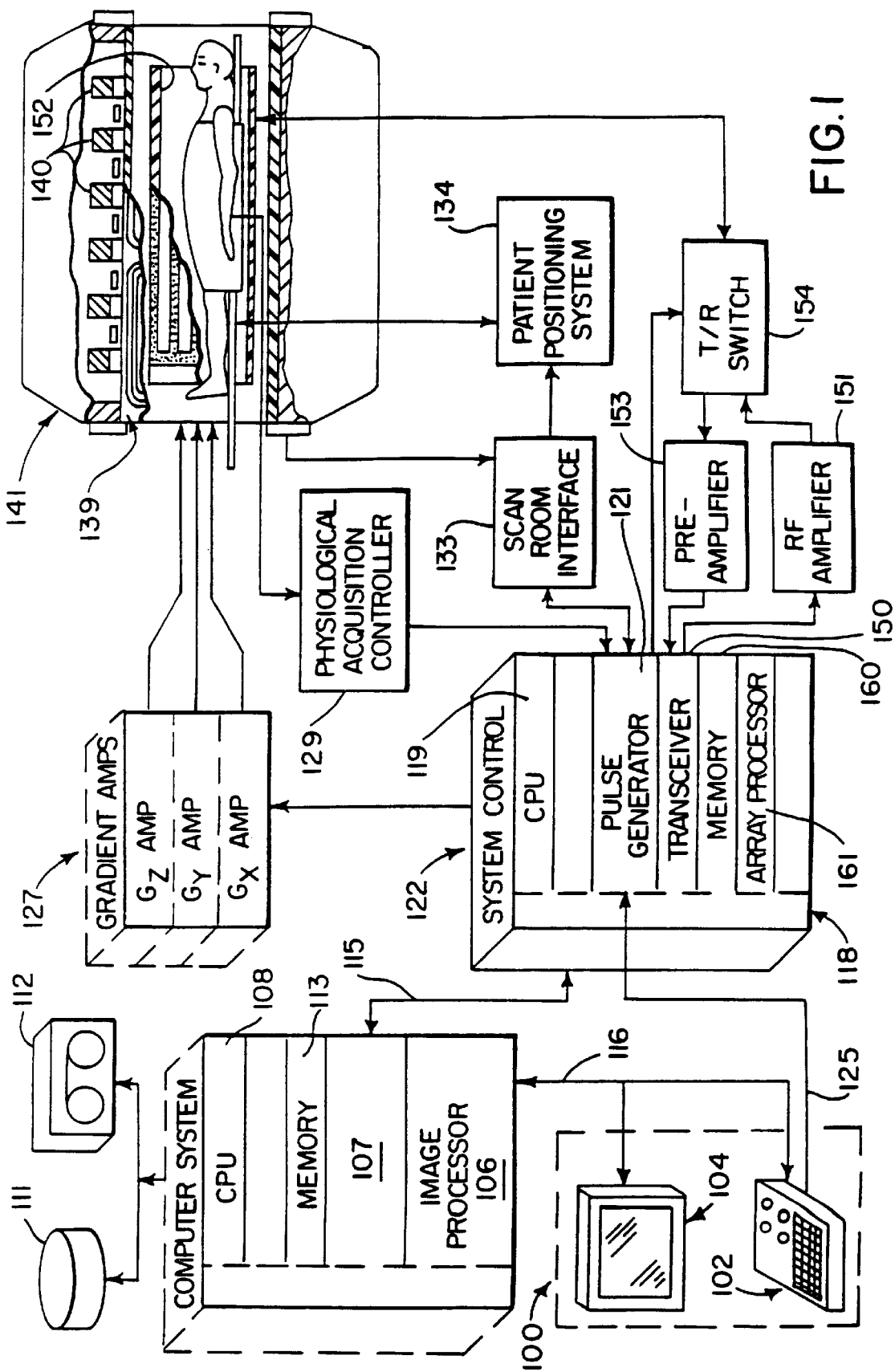
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 1 13, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from sensors connected to the patient, such as respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of k-space NMR data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

Figure 2:
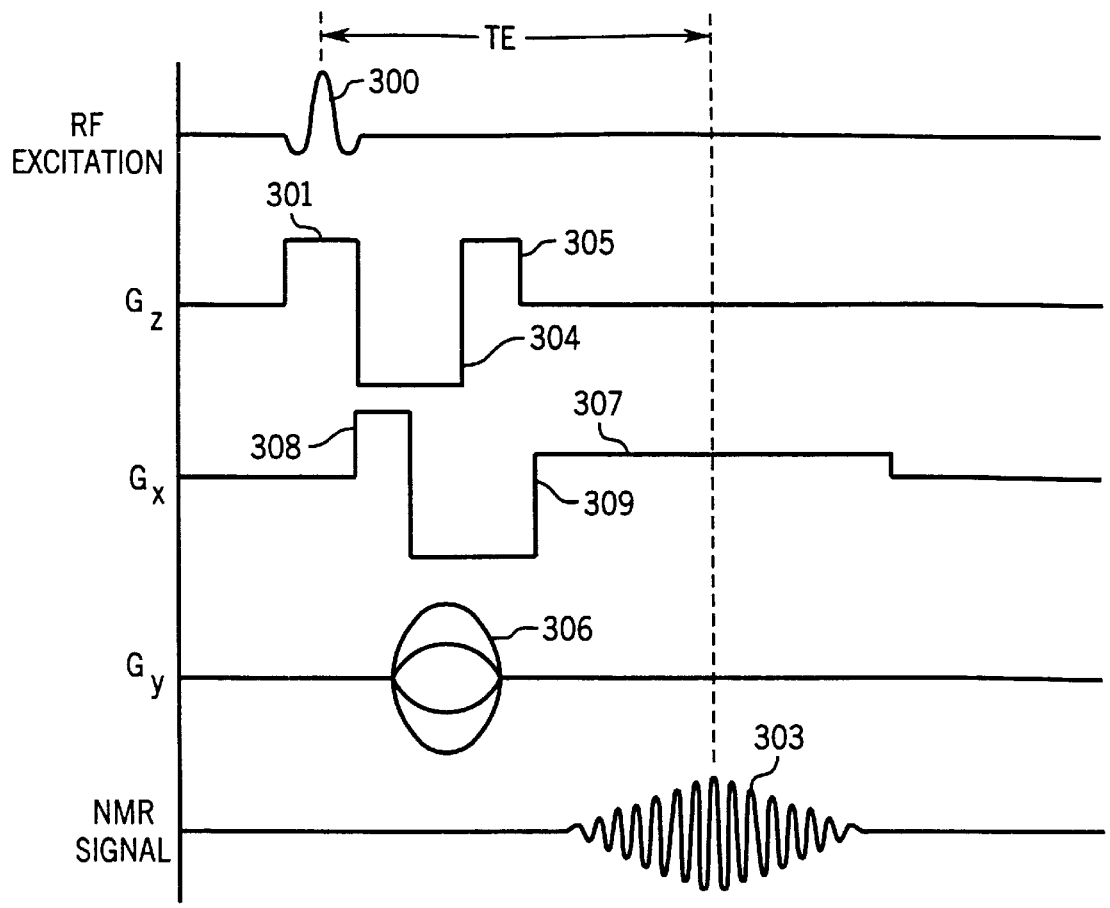
FIG. 2 is an exemplary 3D NMR pulse sequence which may be used when practicing the present invention.

The MRI system of FIG. 1 performs a series of pulse sequences to collect sufficient NMR data to reconstruct the desired image. Referring particularly to FIG. 2, an exemplary 3D gradient recalled echo pulse sequence employs a selective RF excitation pulse 300 which is applied to the subject in the presence of a $G_z$ slice select gradient pulse 301. To compensate the NMR signal 303 which has the maximum intensity located at a time TE after the excitation pulse 300 for the phase shifts caused by the slice select gradient pulse 301 and to desensitize the NMR signal 303 to velocity along the z-axis, a negative $G_z$ gradient pulse 304 followed by a positive $G_z$ gradient pulse 305 are produced by the $G_z$ gradient coils as taught in U.S. Pat. No. 4,731,583. The pulse 304 has multiple amplitudes and provides phase encoding along the z direction. While the pulses 304 and 305 compensate for velocity along the z-axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to localize the position of the spins producing the NMR signal along the y-axis. Position along the x-axis is located by a $G_x$ gradient pulse 307 which is produced as the NMR gradient echo signal 303 is acquired and which frequency encodes the NMR signal 303. Unlike the $G_y$ phase encoding gradient pulse 306, the $G_x$ readout gradient pulse 307 remains at a constant value during the entire scan. To produce the gradient echo 303 and to desensitize it to velocity along the x direction, gradient pulses 308 and 309 precede the gradient pulse 307 as taught in U.S. Pat. No. 4,731,583.

The NMR signal 303 is acquired by the system transceiver 122 and digitized into a row of $N_x$ (e.g. 256) complex numbers which are stored in memory. For each combination of the ($G_y$, $G_z$) phase encoding gradients an NMR signal 303 is produced, acquired, digitized and stored in a separate row of $N_x$ (e.g. 256) complex numbers. At the completion of the scan, therefore, a three-dimensional ($N_x \times N_y \times N_z$) array of k-space data is stored, where $N_y$ is the number of phase encoding steps along the y direction and $N_z$ is the number of phase encoding steps along the z direction.

Figure 3:
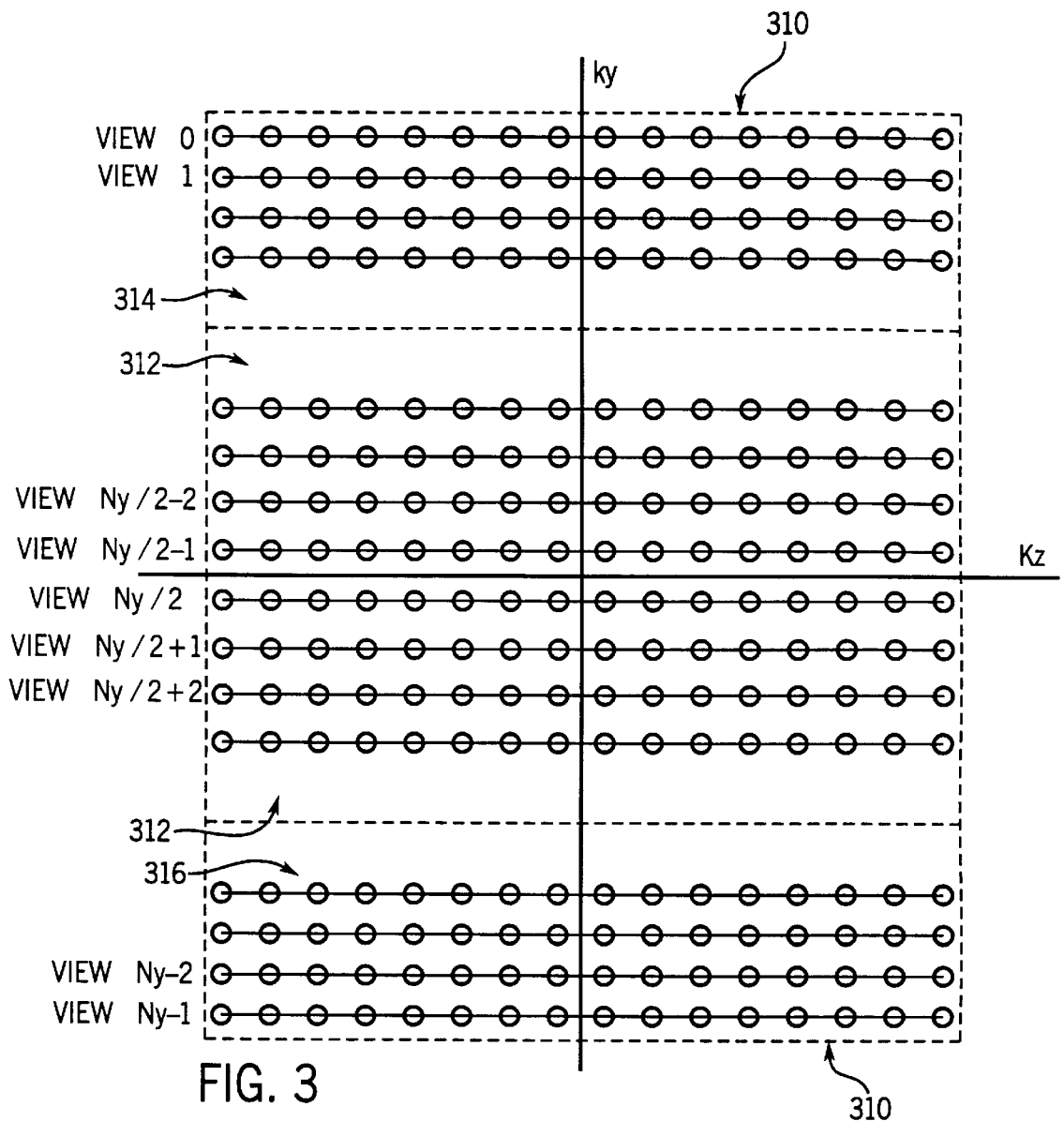
FIG. 3 is a graphic representation of ($k_y$, $k_z$)-space showing its central and peripheral regions in a conventional 3D data acquisition.

This array of k-space data is illustrated by dashed lines 310 in FIG. 3, where the $k_y$ axis indicates the amount of phase encoding along the y axis and the $k_z$ axis is the phase encoding along the z axis. In this example, $N_z$ echoes are acquired in one segment of time (e.g., in one heart beat). One navigator echo is acquired for these $N_z$ imaging echoes. The central region of this k-space data is indicated at 312 and the peripheral regions are indicated at 314 and 316. In one embodiment of the invention indicated in FIG. 3, this k-space is sampled line-by-line in the $k_y$ direction. A look-up table (not shown) is created for $k_y$ phase encodings for the entire scan. This look-up table starts from the center of $k_y$-space and works outward toward the periphery in alternating fashion (i.e. $N_y/2-1$, $N_y/2$, $N_y/2-2$, $N_y/2+1$, $N_y/2-2$, ... 1, $N_y-2$, 0, $N_y-1$). As will be described in more detail below, one index is used to work down from the start of the table (i.e. center of $k_y$-space) and a second index is used to work up from the end of the look-up table (i.e. periphery of $k_y$-space).

Figure 4:
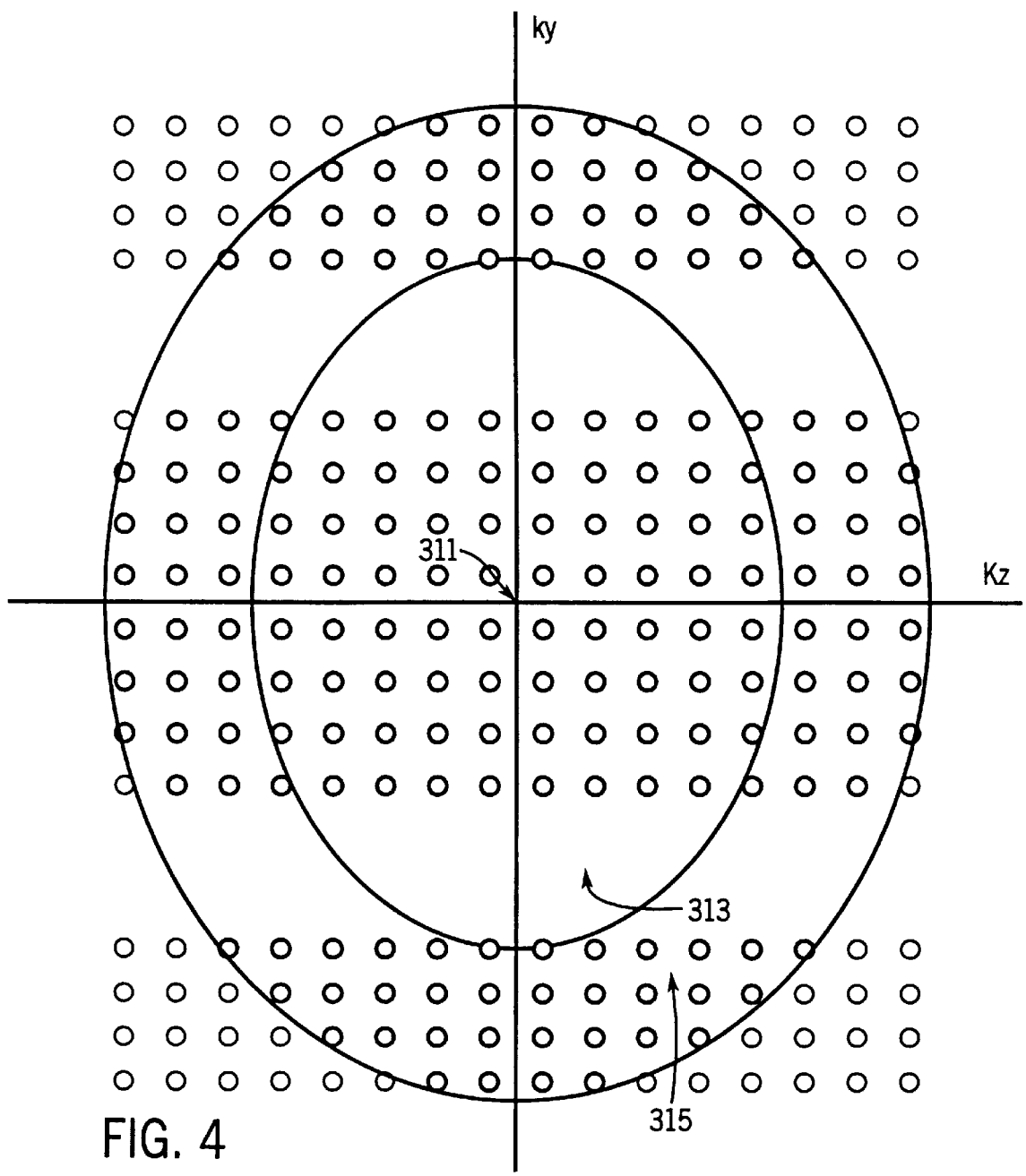
FIG. 4 is a graphic representation of ($k_y$, $k_z$)-space showing its central and peripheral regions in a data acquisition using an elliptical spiral view ordering.

In another embodiment of the invention indicated in FIG. 4, $k_y-k_z$ space is sampled in an elliptical spiral path as described in U.S. Pat. No. 5,122,747 any by A. H. Wilman and S. J. Riederer "*Improved Centric Phase Encoding Orders for Three-Dimensional Magnetization-Prepared MR Angiography*", *Magn. Reson, Med.* 36:384–392 (1996). In this embodiment the look-up table is formed starting with the $k_y-k_z$ sample closest to the origin of k-space indicated at 311, and continuing with samples in a spiral pattern around the origin 311. As a result, k-space samples from an elliptical central region 313 are listed first in the table, and k-space samples in a surrounding annular peripheral region 315 are listed last in the table. As with the first embodiment, the order in which phase encoded views are acquired is determined by working downward from the beginning of this table and working upward from its end until all the views are acquired.

It should be apparent to those skilled in the art that many other NMR pulse sequences may be used and that the invention can be applied to both 2DFT and 3DFT acquisitions. With 3DFT acquisitions the sampling of k-space may be ordered in a spiral pattern as described in U.S. Pat. No. 5,122,747 with the central part of the spiral designated the central region of k-space and the outer part of the spiral k-space sampling designated the peripheral region of k-space.

The acquisition of the k-space NMR data array is performed under the control of respiratory gating signals. Patient respiration may be monitored in a number of ways, such as with a bellows, but in the preferred embodiment it is monitored using NMR navigator signals acquired periodically throughout the scan. As described in U.S. Pat. No. 5,363,844 issued on Nov. 15, 1994 and entitled "*Breath-Hold Monitor for MR Imaging*" which is incorporated herein by reference, the degree of chest inflation is monitored with NMR measurements of the superior-inferior (S/I) position of the patient's diaphragm. The NMR measurements are a series of navigator pulse sequences in which a column of spins located at the right side of the abdomen, and transecting the diaphragm near the dome of the liver is excited by a two-dimensional rf pulse. A subsequent NMR signal is acquired in the presence of a readout gradient ($G_z$ in the preferred embodiment) directed along the lengthwise dimension of the excited column and $N_{echo}$ (e.g. 256) samples of the NMR navigator signal are Fourier transformed by the array processor 161. The two-dimensional excitation rf pulse is, for example, a 30 mm diameter Gaussian excitation which produces a 90° flip angle, although other diameters may also be excited. As described, for example, in U.S. Pat. No. 4,812,760, such two-dimensional rf pulses are produced in the presence of two gradient fields ($G_x$ and $G_y$ in the preferred embodiment) and the receiver low pass filter is set for a field of view (e.g. 260 mm) along the excited column (z axis). The NMR signal is sampled at $N_{echo}$ points during a period of, for example, 4 msec. sample period. The diaphragm position in the excited column appears as an inflection in the acquired and Fourier transformed NMR navigator signal. The position of this inflection is determined by using an edge detection (derivative filter) technique which includes a 20-sample wide averaging filter to reduce higher frequency noise, followed by a 5-sample high pass filter which extracts the diaphragm edge. The diaphragm position can also be detected using the correlation and least-square method as described by Y. Wang et al, "Algorithms for Extracting Motion Information From Navigator Echoes", *Magn. Reson. Med.*, 36:117–123, 1996.

Figure 5:
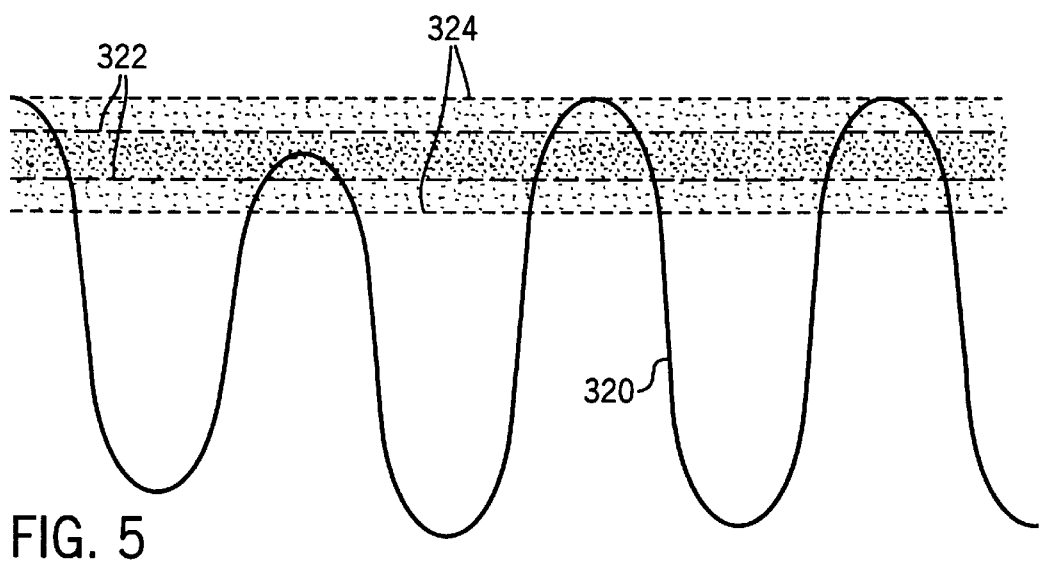
FIG. 5 is a graphic representation of diaphragm position during a typical respiratory cycle which illustrates the narrow and wide acquisition windows according to the present invention.

Referring particularly to FIG. 5, the diaphragm position as monitored by the periodically acquired navigator signals follows a cyclic pattern. Exemplary cycles of this respiration signal are illustrated by line 320, where the upper peaks indicate expiration. It is a teaching of the present invention that two acquisition windows may be established with respect to the respiration signal 320. The first window indicated by dashed lines 322 is relatively narrow and it corresponds to a narrow range of diaphragm positions near expiration. The second window indicated by dotted lines 324 is roughly twice as wide as the window 322 and extends to a band of diaphragm positions on each side of the first window 322. It can be seen that the wider window 324 encompasses a range in which there is more diaphragm motion that will affect data acquisition.

As will now be described in detail, the present invention is a method and apparatus in which one gating signal is produced during the narrow window 322 when the position of the diaphragm is within a narrow range of positions, and a second gating signal is produced during the wide window 324 when the position of the diaphragm is within the band of positions to either side of this narrow range. The first gating signal enables the MRI scanner to acquire k-space data from the central region 312 of k-space, and the second gating signal enables the MRI scanner to acquire k-space data from the peripheral regions 314 and 316.

Referring particularly to FIG. 6, when a scan is performed using the present invention, one of the first steps in the procedure is to perform a reference scan as indicated at process block 350. The reference scan is performed with a navigator signal pulse sequence such as that described above, and the measured diaphragm positions as a function of time are recorded. A number of respiratory cycles are recorded and from the stored diaphragm position information, the range of diaphragm position that define the narrow window 322 and the range of diaphragm position that define the wide window 324 are determined and stored. The image scan is then initialized with the parameters input by the operator as indicated at process block 352. In addition, a view order table 354 is produced. As indicated above, the table 354 indicates the order in which the views are to be acquired during the scan, with the central region views listed first and the peripheral region views listed last. Two indices into the table 354 are maintained. The first is a central view index which is preset to the start, or top, of the table 354 and is incremented to move down the table 354 during the scan. The second index is a peripheral view index which is preset to the end, or bottom, of the table 354 and is decremented to move up the table 354 during the scan.

Referring still to FIG. 6, the MRI system then performs the scan to acquire image data. A loop is entered and the first step as indicated at process block 360 is to perform a navigation pulse sequence to acquire the current position of the patient's diaphragm. This respiration signal is compared with the stored range of diaphragm positions that indicate the boundary of the narrow acquisition window 322. If the respiration is within the narrow window 322 as determined at decision block 362, a first gating signal is indicated and a central view of k-space is acquired using the pulse sequence of FIG. 2, as indicated at process block 364. The central view index is used to read from the top of the view order table 354 the particular view that is to be acquired and it is then incremented. If the respiration signal is not within the narrow window, a test is made at decision block 366 to determine if the diaphragm position is within the range defining the wide acquisition window 324. If so, a second gating signal is indicated and the pulse sequence of FIG. 2 is employed to acquire a peripheral view of k-space as indicated at process block 368. The peripheral view index is used to read from the bottom of the view order table 354 the next peripheral view to be acquired and it is then decremented.

If the respiration signal is outside both windows as determined at decision blocks 362 and 366, no gating signal is indicated and no image data is acquired. The system loops back to acquire another navigation signal and the steps are repeated to determine if image data can be acquired.

The scan continues until all of the k-space image data has been acquired as determined at decision block 370. This occurs when the two indices into the view order table 354 are the same, indicating that all the views listed in the table have been acquired. By employing a single view order table 354 and two indices which work from both ends of the table 354, the boundary between central views and peripheral views is not fixed. Instead, central views will be acquired during the narrow windows 322 and peripheral views will be acquired during wide acquisition windows 324 until the two indices meet somewhere in the middle of the view order table 354.

As indicated at process block 374, when all the k-space views have been acquired, an image is reconstructed as described above and the scan is complete.

It should be apparent to those skilled in the art that many variations are possible from the preferred embodiment described above. For example, the respiration cycle can be monitored using other methods such as a bellows in place of the navigator signal acquired in process block 362. Other pulse sequences can be employed to acquire image data, and the number of views, or the number of NMR signals acquired during each pass through process blocks 364 and 368 can be varied.

What is claimed is:

1. A method for acquiring NMR image data from a subject during a scan with an MRI system, the steps comprising:
   a) monitoring the respiration of the subject;
   b) producing a first gating signal when subject respiration is within a preselected narrow acquisition window;
   c) producing a second gating signal when subject respiration is within a preselected wide acquisition window;
   d) acquiring NMR image data from a central region of k-space when the first gating signal is produced;
   e) acquiring NMR image data from a peripheral region of k-space when the second gating signal is produced; and
   f) repeating steps a) through e) until sufficient NMR image data is acquired from the central and peripheral regions of k-space to reconstruct an image.

2. The method as recited in claim 1 in which step a) is performed using the MRI system to acquire navigator NMR data from which the position of the subject's diaphragm can be measured.

3. The method as recited in claim 2 in which the first gating signal is produced when the subject's diaphragm is within a first, narrow range of measured positions and the second gating signal is produced when the subject's diaphragm is within a second, wide range of measured positions.

4. The method as recited in claim 1 which includes:
   producing a view order table which indicates the order in which NMR image data is to be acquired from k-space, and
   in which step d) includes reading from one end of the view order table an indication of the next NMR image data to be acquired from k-space and step e) includes reading from the other end of the view order table an indication of the next NMR image data to be acquired from k-space.

5. The method as recited in claim 4 in which step f) is completed when all NMR image data indicated in the view order table has been acquired.

6. The method as recited in claim 1 in which steps d) and e) are performed using a three-dimensional Fourier transformation pulse sequence.

7. The method as recited in claim 6 which includes:
   producing a view order table which indicates the magnitudes of phase encoding gradient pulses used in the pulse sequence during each NMR image data acquisition.

8. The method as recited in claim 7 in which the view order table stores values which indicate a spiral sampling order of k-space.

9. The method as recited in claim 8 in which steps d) and e) each include reading a value from the view order table and during the scan values are read in sequence starting at one end of the view order table by step d) and values are read in sequence starting at the other end of the view order table by step e).

10. The method as recited in claim 9 in which step f) is completed when all the values in the view order table have been read and used to acquire NMR image data in steps d) or e).

11. An MRI system for acquiring NMR data from a subject during a scan, the system comprising:
   means for monitoring the respiration of the subject;
   means for producing a first gating signal when subject respiration is within a preselected narrow acquisition window;
   means for producing a second gating signal when subject respiration is within a preselected wide acquisition window;
   means for acquiring NMR image data which includes means for producing magnetic field gradients in response to the first gating signal to sample a central region of k-space;
   means for acquiring NMR image data which includes means for producing magnetic field gradients in response to the second gating signal to sample a peripheral region of k-space; and
   means for continually acquiring additional NMR image data until sufficient NMR image data is acquired from the central and peripheral regions of k-space to reconstruct an image.

12. The MRI system as recited in claim 11 whereby the means for monitoring the respiration of the subject includes means for acquiring navigator NMR data from which the subject's diaphragm can be measured.

13. The apparatus as recited in claim 12 in which the first gating signal is produced when the subject's diaphragm is within a first, narrow range of measured positions and the second gating signal is produced when the subject's diaphragm is within a second, wide range of measured positions.

14. The MRI system as recited in claim 11 further comprising:
   a view order table which indicates the order in which the NMR image data is to be sampled from k-space, and
   in which the means for acquiring NMR image data from the cental region of k-space includes means for reading from a first end of the view order table an indication of the next NMR image data to be acquired from k-space, and
   in which the means for acquiring NMR image data from the peripheral region of k-space includes means for reading from a second end of the view order table an indication of the next NMR image data to be acquired from k-space.

15. The MRI system as recited in claim 11 which further comprises:
   a view order table which indicates the magnitudes of phase encoding gradient pulses used in a pulse sequence during each sampling of k-space.

16. The MRI system as recited in claim 15 whereby the view order table stores values which indicate a spiral sampling order of k-space.

* * * * *